United States Patent
Yarbrough et al.

(10) Patent No.: US 7,893,566 B2
(45) Date of Patent: Feb. 22, 2011

(54) POWER LATCH

(75) Inventors: Roy L. Yarbrough, Hiram, ME (US); Julie Stultz, Scarborough, ME (US); Steven M. Macaluso, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 129 days.

(21) Appl. No.: 12/403,490

(22) Filed: Mar. 13, 2009

(65) Prior Publication Data

US 2010/0231051 A1    Sep. 16, 2010

(51) Int. Cl.
*H02J 1/00* (2006.01)
(52) U.S. Cl. .................. 307/130; 307/64; 307/115
(58) Field of Classification Search ............. 307/64–66, 307/130
See application file for complete search history.

(56) References Cited

U.S. PATENT DOCUMENTS

| | | | | |
|---|---|---|---|---|
| 4,812,672 A | * | 3/1989 | Cowan et al. ................. | 307/64 |
| 5,703,415 A | * | 12/1997 | Tanaka ........................ | 307/66 |
| 5,945,816 A | * | 8/1999 | Marusik ...................... | 323/273 |
| 6,285,091 B1 | * | 9/2001 | Chan et al. .................... | 307/64 |
| 7,298,181 B2 | * | 11/2007 | Khan. P et al. ................ | 327/70 |
| 7,332,833 B2 | * | 2/2008 | Pan et al. ....................... | 307/65 |
| 2002/0113494 A1 | * | 8/2002 | Winick et al. ................ | 307/85 |
| 2004/0217653 A1 | * | 11/2004 | Neidorff ...................... | 307/80 |
| 2007/0176666 A1 | * | 8/2007 | Arslan et al. ................. | 327/333 |

FOREIGN PATENT DOCUMENTS

WO    WO9429963    12/1994

* cited by examiner

*Primary Examiner*—Jared J Fureman
*Assistant Examiner*—Adi Amrany
(74) *Attorney, Agent, or Firm*—Cesari and McKenna, LLP; Edwin H. Paul

(57) ABSTRACT

A circuit that automatically, seamlessly connects the higher (or the lower) of two power supplies to an output is described. The circuit does not incur a one diode drop when the two power supplies are at about the same voltage levels, and the unused power supply draws no stand-by current. Cross coupled transistor and cross coupled inverters are employed.

4 Claims, 2 Drawing Sheets

POWER LATCH

BACKGROUND OF THE INVENTION

1. Field of the Invention

The present invention relates to selecting between two power supplies, in particular to selecting the higher (or the lower) power supply while using no standby current and incurring no additional voltage drops.

2. Background Information

Electronic systems often require back up power supplies where, when a primary system voltage fail, a back up supply is automatically, seamlessly switched in to power the system.

There are examples of prior art where others have developed automatic selection circuits that will select the higher of two power supplies. One problem with the prior art selection circuits, where the back-up is a battery supply, is that there often is a current drain from the battery prior to being switched in that will shorten its life.

Other prior art systems have limitations when two power supply voltages are within the threshold voltage, Vt, of switching transistor devices, typically MOS devices, that are used to connect one supply to an output. When this occurs, neither transistor is on. Usually, a diode drop will be employed to maintain a voltage at the output equal to the higher voltage less the diode drop.

Moreover, the difference between the two power supplies is the Vgs of the on MOS transistor. As the two power supplies come closer in voltage the Vgs of the on MOS transistor becomes marginal, not fully turned on, and the output voltage is lowered accordingly.

FIG. 1 illustrates a prior art cross couple MOS transistor circuit that connects the higher of two power supplies, V1 and V2, to the Vout. Here V1 is +3.6V and V2 is +1.8V. M1's Vgs is 1.8V and if that exceeds the threshold of M1 it is on and M2 is off. Vout will be about +3.6V. If V1 falls enough such that the Vgs of M2 turns on M2, then V2, +1.8V, will be connected via M2 to Vout. Here M1 will be off.

In the case where M1 and M2 are both at +1.8V, neither M1's nor M2's Vgs threshold are met and both M1 and M2 are off. In some applications M1 and M2 can be constructed with their N wells connected to their sources thereby producing a "body diode" that are shown as D1 and D2. In other embodiments external diodes may be used. With the body diodes present the Vout will be one diode drop below the higher of V1 and V2. If V1 and V2 are both about +1.8V, Vout will be about +1.1V.

Herein "connected" is defined broadly to include substantially passive components interposed between the points being "connected."

In other systems, it may be convenient to automatically select the lower of power supplies to power a system. Due to use of several different integrated circuitry technologies, several different power supplies may be in use within one system. In such systems it may be convenient to automatically select he lower of the power supplies. Such a selection may apply where the power consumption of a system is lowered, for example, when the system in placed into a hibernate or other such low powered state.

U.S. Pat. No. 7,298,181 B2 to Khan et al. describes a circuit that outputs the higher of two power supply voltages. A comparator receives both supplies and output a signal that, via an inverter, turns on one MOS transistor, and another off, connecting the higher voltage to an output. The comparator is powered from both power supplies and always draws current.

Some limitations of the prior art are addressed by the present invention.

SUMMARY OF THE INVENTION

The present invention provides for a circuit that selects the higher or the lower of two power supplies, wherein the unselected power supply draws no stand-by current. When the two power supplies are near same voltage, one of the MOS transistor is fully on providing a full supply voltage to the output.

In one embodiment, the present invention provides additional inverters that fully turns on one of two MOS transistors even when the two supplies output the same voltage. In an embodiment, the transistor that is driving the output voltage will have the highest Vgs voltage possible. That is this transistor is fully on (in contrast to the prior art) even when the two power supplies are at or near the same output voltage.

Illustratively, cross coupled inverters, one powered by one power supply and the other powered by the other power supply, drive the output transistors. The cross coupled inverters will provide a the largest turn on voltage to one of the output transistors while keeping the other off with the largest turn off voltage possible. This operation of the inverters provides for outputting the full power supply via an on transistor even when the two power supplies are at the same voltage. There will be no body diode drop as in the prior art.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
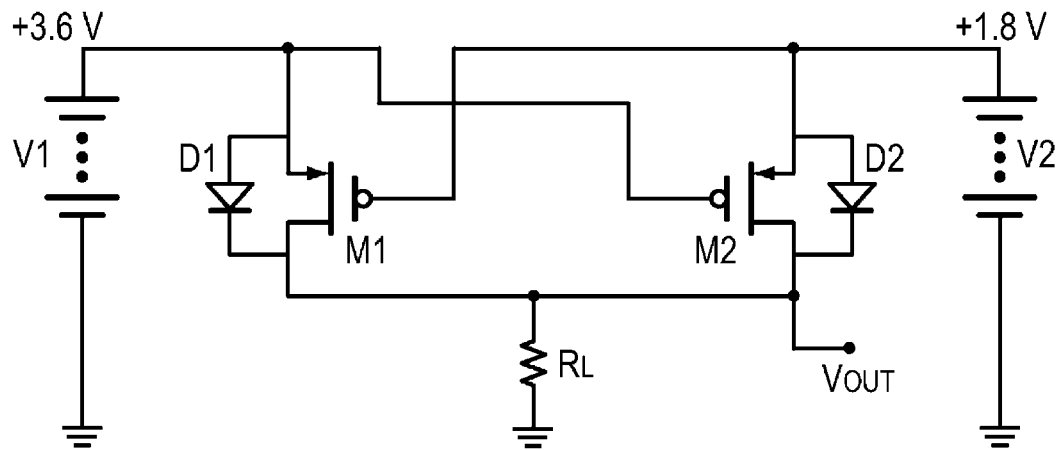
FIG. 1 is a schematic of a prior art circuit that selects the higher of two voltage supplies.
Figure 2:
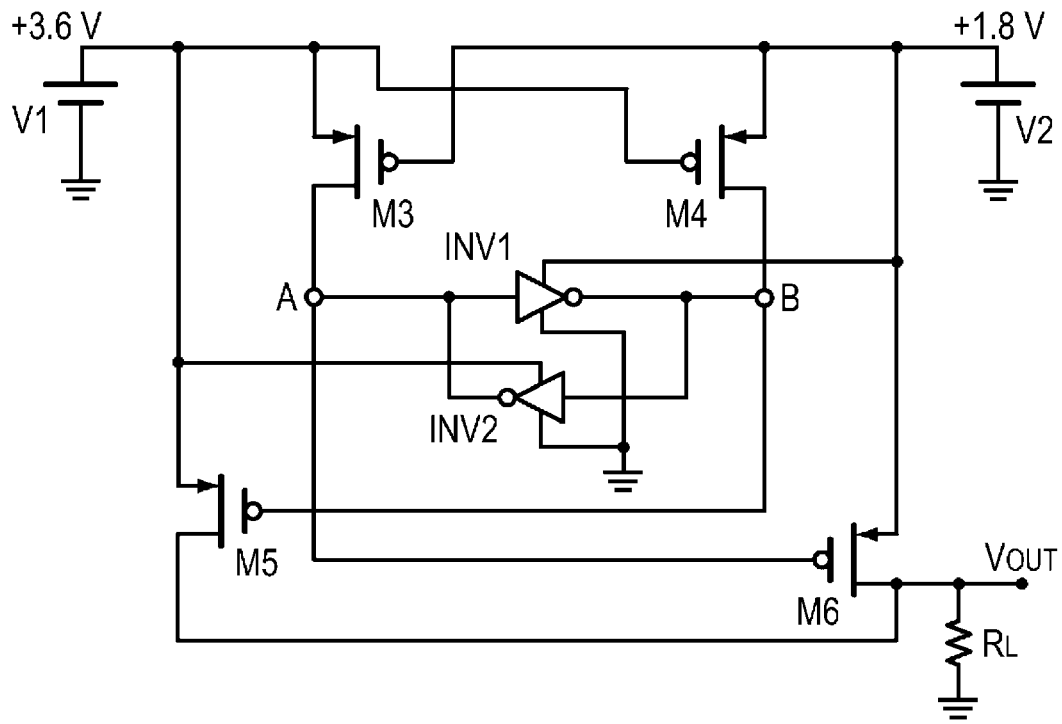
FIG. 2 is a schematic embodying the present invention.

FIG. 2 includes the M3 and M4 cross coupled MOS transistors similar to M1 and M2 of FIG. 1, but the N-well is connected (not shown) to the drain instead of the source of the transistors M3 and M4, thereby disabling the "body diodes." FIG. 2 also adds inverters, INV1 and INV2, and transistors M5 and M6.

In the circuit as shown, V1 is +3.6V and V2 is +1.8V. M3 is on and M4 is off, point A is at +3.6V, point B is ground via INV1. Point B at ground drive M5 fully on providing +3.6V to Vout. Note that INV1 is powered by +1.8V and INV2 is powered by +3.6V, but still B will be driven to ground.

If V1 drops to +1.8V (where M1 and M2 were both off in FIG. 1) M3 and M4 will both be off, but INV1 and INV2 form cross coupled inverters, both powered by +1.8V and ground, they will latch each other and maintain transistor M5 on and +1.8V is provided to Vout. If V1 continues lowered M4 will turn on and reset the inverter latch. In the instance with M4 on, point B rises and point A falls turning on M6. The +1.8V from V2 will be supplied to Vout through M6.

By changing the source contact of M5, M6, INV1 and INV2 to the other power supply, the lower of the two power supplies, V1 and V2, will be presented to Vout.

Figure 3A:
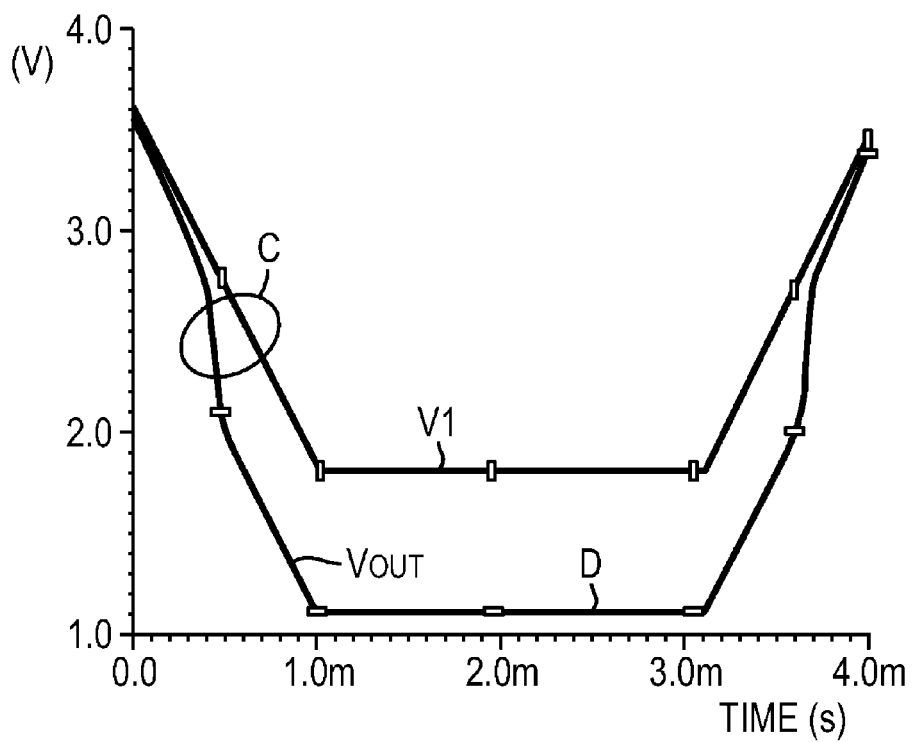
FIG. 3A is a chart illustrating the operation of the prior art circuit of FIG. 1.
Figure 3B:
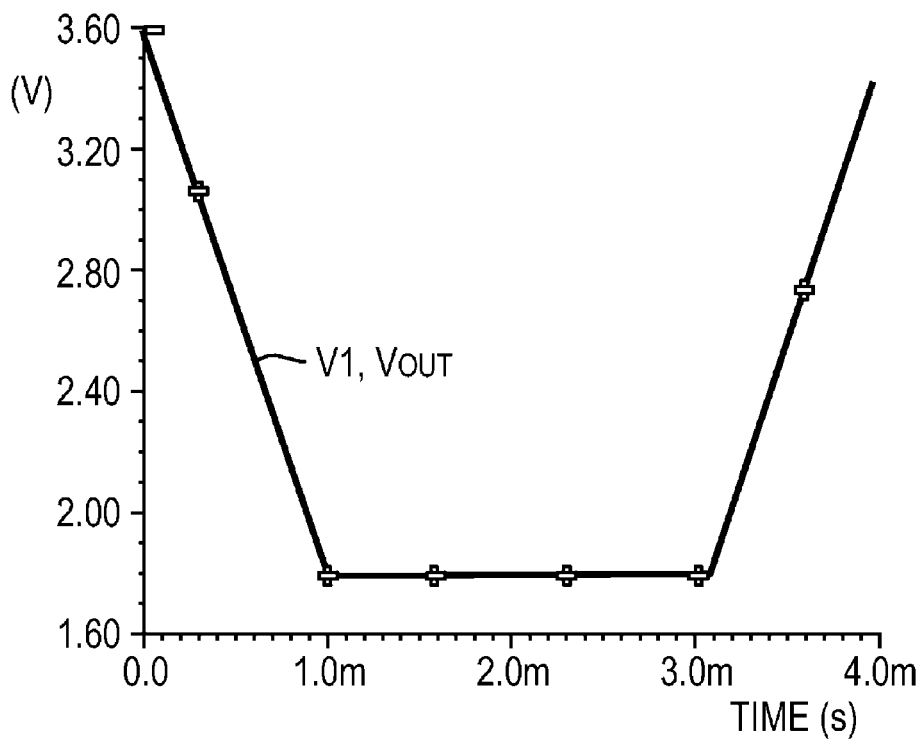
FIG. 3B is a chart of the operation of an embodiment of the present invention.

FIGS. 3A and 3B show two traces as V1 sweeps from +3.8V to +1.8V and then back to +3.8V. FIG. 3A illustrates V1 and Vout of the prior art circuit of FIG. 1. At point C Vout starts to diverge from V1 as M1 starts to turn off, and when V1 is at +1.8V, Vout is a full diode drop lower at point D. Compare this to FIG. 3B traces. Note that as V1 sweeps down to +1.8V, Vout stays right with V1, there is no extra diode drop.

Although not shown directly, bipolar and hybrid transistors may be used in place of the MOS transistors shown herein. Control and other voltages levels will change, but the configuration and results will be similar. For these other transistor types, MOS gates become bases, drains become collectors, and sources become emitters.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A circuit that connects the higher voltage of two power supplies to an output, the circuit comprising:
    a first transistor with its source connected to a first power supply and its gate to a second power supply;
    a second transistor with its source connected to the second power supply and its gate to the first power supply;
    cross coupled first and second inverters, the first inverter input connected to the first transistor drain and the second inverter input connected to the second transistor drain; the first inverter powered by the second power supply and the second inverter powered by the first power supply; the input of the first inverter connected to the output of the second inverter, and the input of the second inverter connected to the output of the first inverter;
    a third transistor with its gate connected to the drain of the second transistor, its source connected to the first power supply and its drain connected to the output voltage; and
    a fourth transistor with its gate connected to the first transistor drain, its source connected to the second power supply and its drain connected to the output.

2. The circuit of claim 1, where the power supply connections from the third and the fourth transistors are switched and the power supply connections of the first and second inverters are switched, wherein the circuit now outputs the lower of the two power supplies rather than the higher.

3. A method for connecting the higher of two power supplies to an output voltage, the method comprising:
    connecting a first transistor source to a first power supply and its gate to a second power supply;
    connecting a second transistor source to the second power supply and its gate to the first power supply;
    cross-coupling first and second inverters, the first inverter input connected to the first transistor drain and the second inverter input connected to the second transistor drain; the first inverter powered by the second power supply and the second inverter powered by the first power supply; the input of the first inverter connected to the output of the second inverter, and the input of the second inverter connected to the output of the first inverter;
    connecting a third transistor gate to the drain of the second transistor, its source connected to the first power supply and its drain connected to the output voltage; and connecting a fourth transistor gate to the first transistor drain, its source connected to the second power supply and its drain connected to the output voltage.

4. The method of claim 3, switching the power supply connections of the third and the fourth transistors and the power supply connections of the first and second inverters, wherein the circuit now outputs the lower of the two power supplies rather than the higher.

\* \* \* \* \*